US011852979B2

(12) United States Patent
Wu et al.

(10) Patent No.: US 11,852,979 B2
(45) Date of Patent: Dec. 26, 2023

(54) LENS ADJUSTMENT FOR AN EDGE EXPOSURE TOOL

(71) Applicant: Taiwan Semiconductor Manufacturing Company, Ltd., Hsinchu (TW)

(72) Inventors: Yong-Ting Wu, Tainan (TW); Yu Kai Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/809,566

(22) Filed: Jun. 29, 2022

(65) Prior Publication Data

US 2022/0342318 A1 Oct. 27, 2022

Related U.S. Application Data

(63) Continuation of application No. 17/248,074, filed on Jan. 7, 2021, now Pat. No. 11,378,888.

(51) Int. Cl.
*G03F 7/00* (2006.01)
*G03F 7/20* (2006.01)

(52) U.S. Cl.
CPC .......... *G03F 7/70141* (2013.01); *G03F 7/203* (2013.01); *G03F 7/2028* (2013.01)

(58) Field of Classification Search
CPC ..... G03F 7/2028; G03F 7/70833; G02B 7/04; G02B 7/09; G02B 7/10; G02B 7/102
See application file for complete search history.

(56) References Cited

U.S. PATENT DOCUMENTS 4,555,165 A * 11/1985 Negoro ..................... G02B 7/04
359/696
5,880,816 A * 3/1999 Mimura ................ G03F 7/2028
356/612

(Continued)

FOREIGN PATENT DOCUMENTS

JP H09 162120 A * 6/1997 ........... H01L 21/027
KR 2006107986 A * 10/2006 ........... G03F 7/2028

OTHER PUBLICATIONS

Machine translation of KR-2006107986-A, 2006 (Year: 2006).*
Machine translation of JP H09162120 A (Year: 1997).*

*Primary Examiner* — Steven Whitesell Gordon
(74) *Attorney, Agent, or Firm* — Harrity & Harrity, LLP

(57) ABSTRACT

An edge exposure tool may include a lens adjustment device that is capable of automatically adjusting various parameters of an edge exposure lens to account for changes in operating parameters of the edge exposure tool. In some implementations, the edge exposure tool may also include a controller that is capable of determining edge adjustment parameters for the edge exposure lens and exposure control parameters for the edge exposure tool using techniques such as big data mining, machine learning, and neural network processing. The lens adjustment device and the controller are capable of reducing and/or preventing the performance of the edge exposure tool from drifting out of tolerance, which may maintain the operation performance of the edge exposure tool and reduce the likelihood of wafer scratching, and may reduce the down-time of the edge exposure tool that would otherwise be caused by cleaning and calibration of the edge exposure lens.

20 Claims, 8 Drawing Sheets

(56) References Cited

U.S. PATENT DOCUMENTS

| | | |
|---|---|---|
| 5,929,976 A | 7/1999 | Shibuya et al. |
| 11,378,888 B1 * | 7/2022 | Wu ........................ G03F 7/2022 |
| 2002/0092964 A1 * | 7/2002 | Kim ....................... G03F 7/2028 |
| | | 250/201.2 |
| 2002/0171818 A1 * | 11/2002 | Minnaert ............ G03F 7/70058 |
| | | 355/71 |
| 2011/0063588 A1 | 3/2011 | Kashiyama et al. |
| 2013/0083305 A1 | 4/2013 | Wu et al. |
| 2016/0170311 A1 | 6/2016 | Schmitt-Weaver et al. |

* cited by examiner

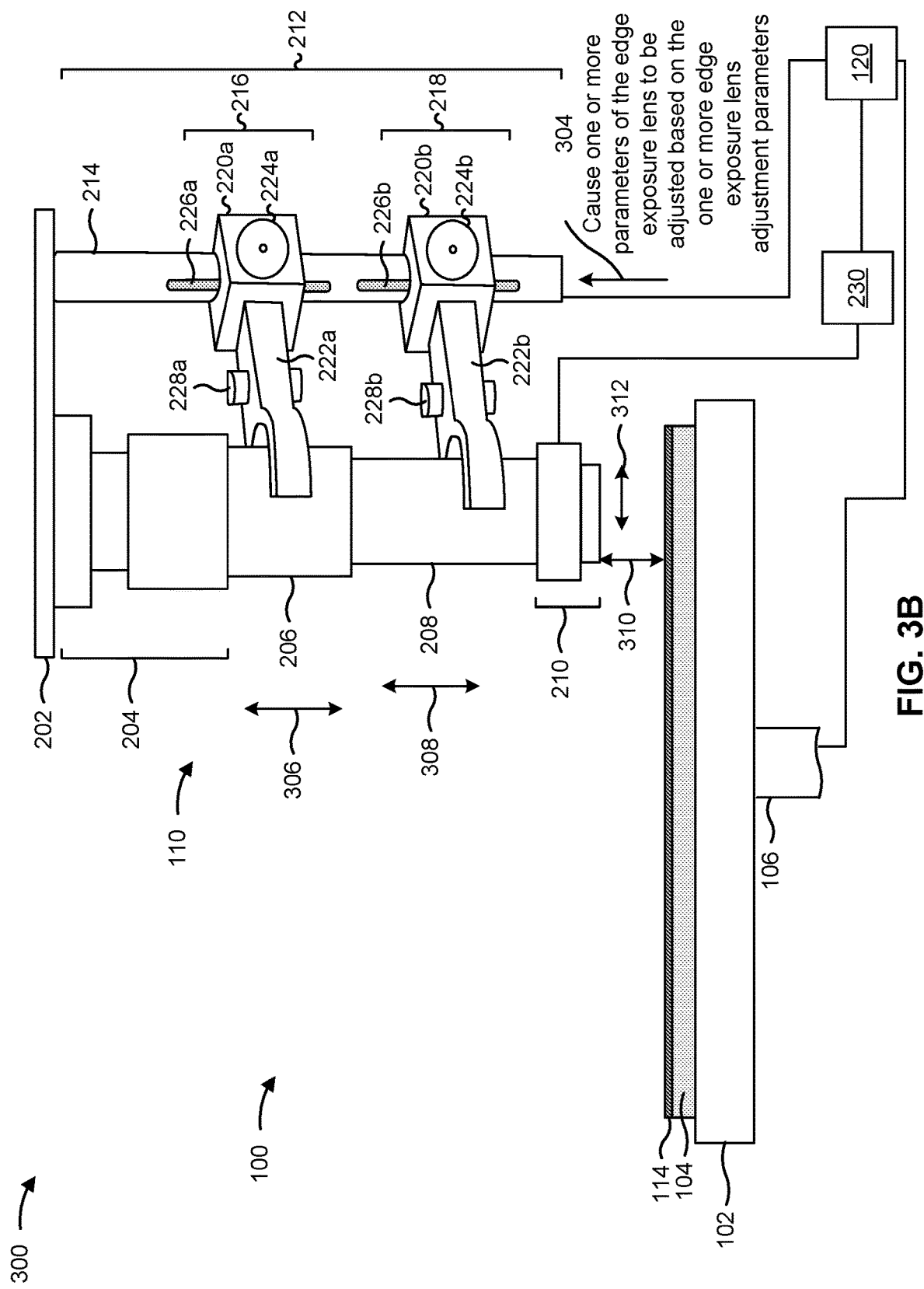

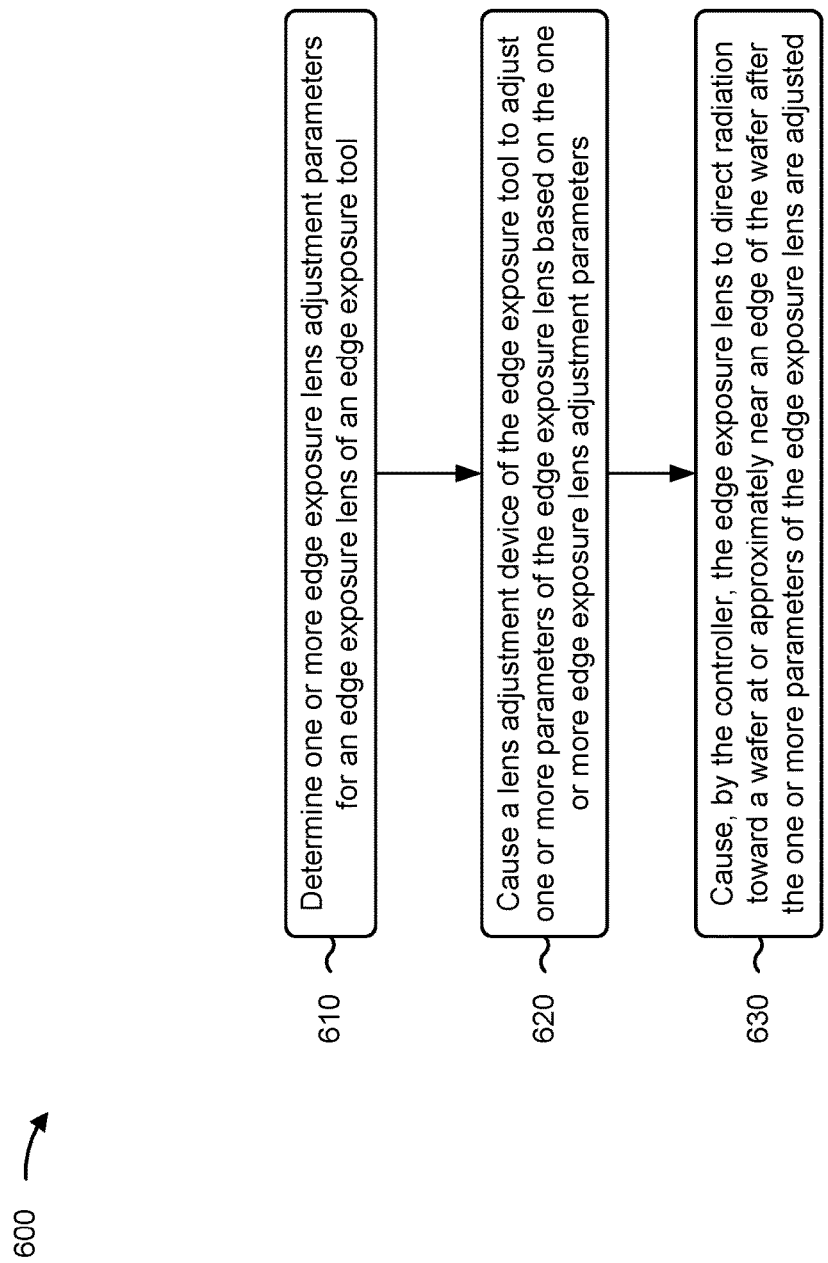

LENS ADJUSTMENT FOR AN EDGE EXPOSURE TOOL

RELATED APPLICATION

This application is a continuation of U.S. patent application Ser. No. 17/248,074, filed Jan. 7, 2021 (now U.S. Pat. No. 11,378,888), which is incorporated herein by reference in its entirety.

BACKGROUND

A wafer edge exposure (WEE) tool is a semiconductor processing tool that is capable of processing an edge of a wafer along an outer perimeter of the wafer. As an example, a WEE tool may be used to expose a photoresist layer on the edge to seal the edge of the wafer while leaving the remaining portions of the photoresist layer unexposed, which may protect the edge of the wafer contaminants. As another example, a WEE tool may be used to expose a photoresist layer on the edge of the wafer to expose alignment marks covered by the photoresist layer, which permits the wafer to be aligned during subsequent semiconductor processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3C are diagrams of an example implementation described herein.

FIGS. 5 and 6 are flowcharts of example processes relating to adjusting an edge exposure lens.

DETAILED DESCRIPTION

Figure 1:
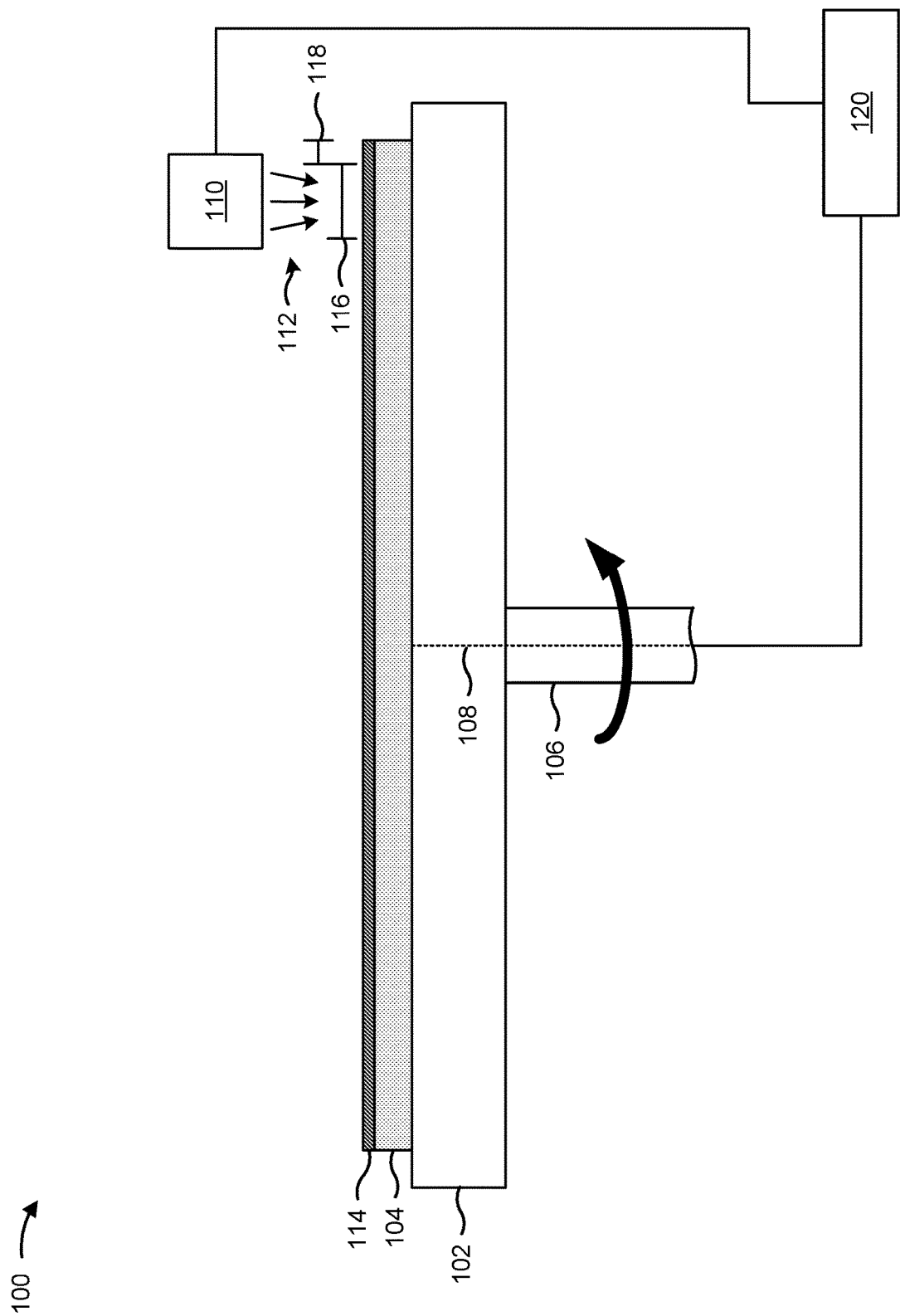
FIGS. 1 and 2 are diagrams of an example edge exposure tool described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A wafer edge exposure (WEE) tool may include a vacuum chuck on which a wafer is mounted. A WEE tool may also include a lens that is connected to an electromagnetic radiation source. The lens may be used to focus electromagnetic radiation from the electromagnetic radiation source toward the edge of a wafer. Operation of the WEE tool may cause some operating parameters of the WEE tool to shift or change over time and from cycle to cycle. For example, the vertical and/or horizontal position of the lens may change over time, the lens may become fogged due to repeated exposure cycles, the WEE tool may be used on wafers having different edge thicknesses, and/or the condition of the electromagnetic radiation source may degrade over time and over an accumulation of exposure cycles. As a result, the position of the lens, the focus of the lens, the illuminance of the lens, and/or other parameters may change over repeated cycles of the WEE tool, which can result in the performance of the WEE tool drifting out of tolerance. This may result in reduced operation performance of the WEE tool, and may result in scratches on the surface of a wafer due to improper lens positioning.

Some implementations described herein provide an edge exposure tool (e.g., a WEE tool) that includes a lens adjustment device. The lens adjustment device is capable of automatically adjusting various parameters of an edge exposure lens of the edge exposure tool to account for changes in operating parameters of the edge exposure tool over time and from cycle to cycle. The edge exposure tool may include a controller that is capable of determining one or more edge adjustment parameters for the edge exposure lens and one or more exposure control parameters for the edge exposure tool using techniques such as big data mining, machine learning, and neural network processing. In this way, the lens adjustment device and the controller are capable of reducing and/or preventing the performance of the edge exposure tool from drifting out of tolerance, which can maintain the operation performance of the edge exposure tool and reduce the likelihood of wafer scratching. Moreover, in this way, the lens adjustment device and the controller may reduce the downtime of the edge exposure tool that would otherwise be caused by cleaning and calibration of the edge exposure lens, which increases the productivity and throughput of the edge exposure tool.

FIG. 1 is a diagram of an example edge exposure tool 100 described herein. In some implementations, the edge exposure tool 100 includes a WEE tool. In some implementations, the edge exposure tool 100 is included in another tool such as a photoresist coating tool, a coater/developer tool, or in another type of semiconductor processing tool.

As shown in FIG. 1, the edge exposure tool 100 may include a vacuum chuck 102 configured to support and secure a wafer 104. For example, the vacuum chuck 102 may include a platform on which the wafer 104 may be placed and supported, and one or more openings through the platform. A negative pressure may be generated through the openings, which causes a suction force on the bottom surface of the wafer 104. This suction force pulls the wafer toward the platform and secures the wafer 104 in place. The platform may be sized to accommodate a particular size of wafer (e.g., a 300 millimeter (mm) wafer) or may be sized to accommodate multiple sizes of wafers (e.g., 200 mm wafers and 300 mm wafers).

The vacuum chuck 102 may be attached to a spindle 106. The spindle 106 may be configured to spin or rotate the platform of the vacuum chuck 102. The rotation of the platform of the vacuum chuck 102 may also spin or rotate the wafer 104 on the platform of the vacuum chuck 102. The spindle 106, the vacuum chuck 102, and the wafer 104 may all spin or rotate about a central axis 108 to provide an approximately symmetrical and uniform rotation of the wafer 104.

The edge exposure tool 100 may include an edge exposure lens 110 configured to direct and/or focus radiation 112 toward a photoresist layer 114 on the wafer 104. The edge exposure lens 110 may be configured to direct the radiation 112 (e.g., electromagnetic radiation) toward the photoresist layer 114 in an exposure field 116 at or approximately near (e.g., a distance 118 from) an edge of the wafer 104. In particular, the edge exposure lens 110 may direct and/or focus the radiation 112 toward the wafer 104 when or while the wafer 104 is spun or rotated about the axis 108. In this way, the radiation 112 may be directed toward the photoresist layer 114 in the exposure field 116 along the circumference of the wafer 104 as the wafer spins or rotates.

The edge exposure tool 100 may include a controller 120, which may include a microcontroller, a processor, or a device that includes a microcontroller or processor. The controller 120 may be communicatively connected to the vacuum chuck 102, the spindle 106, and the edge exposure lens 110. The controller 120 may receive signals from the vacuum chuck 102, the spindle 106, and/or the edge exposure lens 110 (or from sensors associated with the vacuum chuck 102, the spindle 106, and/or the edge exposure lens 110). The received signals may include position information (e.g., position information associated with the edge exposure lens 110), actuation information (e.g., rotational speed associated with the vacuum chuck 102 and/or the spindle 106), and/or one or more other types of information. The controller 120 may provide signals to the vacuum chuck 102, the spindle 106, and/or the edge exposure lens 110 (or to actuators associated with the vacuum chuck 102, the spindle 106, and/or the edge exposure lens 110). The signals may include digital signals (e.g., communications, instructions, commands, requests, and/or other types of digital signals) and/or analog signals (e.g., voltages, currents, and/or other types of analog signals). The signals may cause the vacuum chuck 102, the spindle 106, and/or the edge exposure lens 110 to actuate in a particular manner, such as to spin at a particular rotational velocity or revolutions per minute (RPM), to direct the radiation 112 toward the wafer 104 in a particular exposure field 116 and/or at a particular exposure intensity, or the like.

As indicated above, FIG. 1 is provided as an example. Other examples may differ from what is described with regard to FIG. 1.

Figure 2:
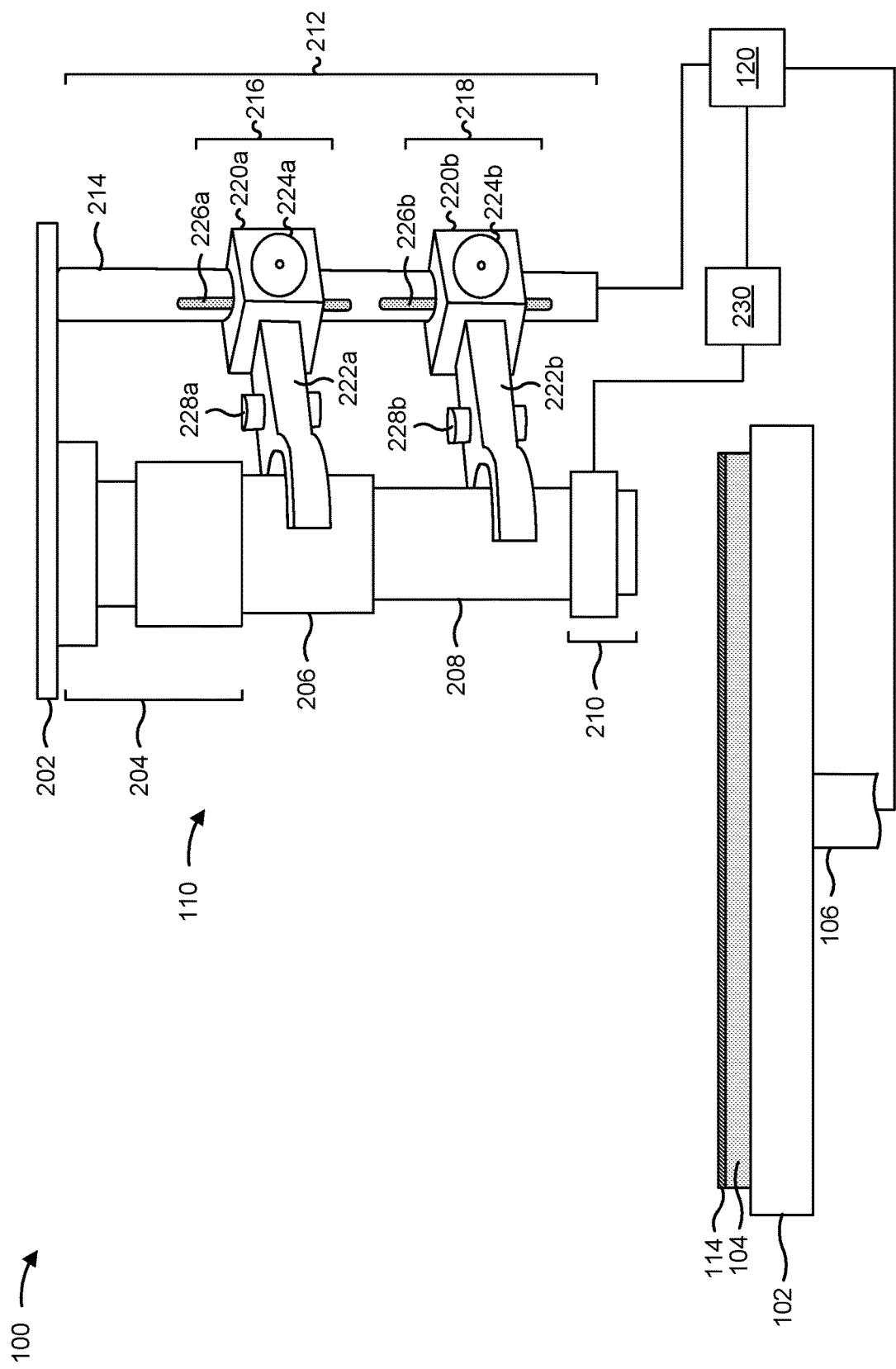

FIG. 2 is a diagram of the example edge exposure tool 100 described herein. FIG. 2 illustrates a detailed view of the edge exposure lens 110. As shown in FIG. 2, the edge exposure lens 110 may be mounted to and/or supported by a mounting plate 202 inside of a processing chamber of the edge exposure tool 100. The mounting plate 202 may include a track, a rail, a guide, or another structure that permits the horizontal position of the edge exposure lens 110 to be adjusted. The horizontal position of the edge exposure lens 110 may be adjusted such that the edge exposure lens 110 (and the resulting exposure field 116) is moved inward closer toward the center of the wafer 104 or outward closer toward the edge of the wafer 104. The edge exposure lens 110 may also include a vertical adjustment section 204, which includes one or more subsections configured to permit the height or vertical position of the edge exposure lens 110 to be adjusted.

The edge exposure lens 110 may include a first section 206 and a second section 208. The first section 206 and the second section 208 may be adjustable sections of the edge exposure lens 110 in that the height or vertical position of the first section 206 and the second section 208 is permitted to be adjusted. The first section 206 may be interfaced with the vertical adjustment section 204 in a manner that permits the height or vertical position of the first section 206 to be adjusted relative to the height or vertical position of the vertical adjustment section 204. For example, the first section 206 may be inserted into the vertical adjustment section 204 (or one or more of the subsections included in the vertical adjustment section 204) such that the first section 206 is permitted to slide internally in the vertical adjustment section 204. As another example, the first section 206 may be positioned around the vertical adjustment section 204 (or one or more of the subsections included in the vertical adjustment section 204) such that the vertical adjustment section 204 is inserted into the first section 206. The vertical adjustment section 204 may be permitted to slide internally in the first section 206 to adjust the height or vertical position of the first section 206.

The second section 208 may be interfaced with the first section 206 in a manner that permits the height or vertical position of the second section 208 to be adjusted. Moreover, the second section 208 may be interfaced with the first section 206 in a manner that permits the height or vertical position of the second section 208 and the height or vertical position of the first section 206 to be adjusted separately of and/or independently. For example, the second section 208 may be inserted into the first section 206 such that the second section 208 is permitted to slide internally in the first section 206. As another example, the second section 208 may be positioned around the first section 206 such that the first section 206 is inserted into the second section 208. The first section 206 may be permitted to slide internally in the second section 208 to adjust the height or vertical position of the second section 208.

The edge exposure lens 110 may include a lens section 210 attached to and/or supported by the second section 208. The lens section 210 may include one or more lens elements or lenses. The radiation 112 may travel through the vertical adjustment section 204, the first section 206, the second section 208, and through the lens section 210. The lens(es) of the lens section 210 may focus or direct the radiation 112 toward the photoresist layer 114 on the wafer 104.

The height or vertical position of the lens section 210 may be adjusted by adjusting the height or vertical position adjustment of the first section 206 and/or the height or vertical position adjustment of the second section 208. Adjustments to the height or vertical position of the lens section 210 may change the distance between the lens section 210 and the top surface of the photoresist layer 114. Adjusting the distance between the lens section 210 and the top surface of the photoresist layer 114 may be one technique for increasing or decreasing the size of the exposure field 116 on the photoresist layer 114. Additionally or alternatively, the size of the exposure field 116 may be adjusted by increasing or decreasing the size of the aperture through which the radiation 112 travels through the lens section 210 and toward the photoresist layer 114.

As further shown in FIG. 2, the edge exposure tool 100 includes a lens adjustment device 212 configured to adjust one or more parameters of the edge exposure lens 110 or one or more components thereof. For example, the lens adjustment device 212 may be configured to adjust the horizontal position of the edge exposure lens 110, may be configured to adjust the distance between the lens section 210 and the top surface of the wafer 104 (e.g., the top surface of the photoresist layer 114 on the wafer 104), may be configured to adjust the height or vertical position of the first section 206 and/or the second section 208, and/or may be configured to adjust one or more other parameters of the edge exposure lens 110.

The lens adjustment device 212 may include an elongated support member 214 that may be mounted to and/or supported by the mounting plate 202. In some implementations, the elongated support member 214 is mounted to and/or supported by another structure of the edge exposure tool 100, such as a table or a wall. The lens adjustment device 212 may include a plurality of lens adjustment elements, including a first lens adjustment element 216 configured to adjust the first section 206, and a second lens adjustment element 218 configured to adjust the second section 208.

The first lens adjustment element 216 may include a housing 220a, a first support arm 222a attached to the housing 220a and configured to support the first section 206. The first support arm 222a may be inserted in the housing 220a and configured to slide in the housing 220a to adjust the horizontal position of the first section 206. The first lens adjustment element 216 may also include an adjustment motor 224a mounted to the housing 220a. The adjustment motor 224a may be connected to one or more gears, sprockets, and/or other internal components that, together, are configured to adjust the height or vertical position of the first lens adjustment element 216 (and thus, the height or vertical position of the first section 206). The adjustment motor 224a may include a stepper motor, a direct current (DC) motor, or another type of motor. The adjustment motor 224a may move the first lens adjustment element 216 along the elongated support member 214. In particular, the adjustment motor 224a may move the first lens adjustment element 216 along a track 226a on the elongated support member 214. The gears and/or sprockets in the housing 220a may interface with the track 226a to move the first lens adjustment element 216 up and down along the elongated member 214 in a precise and controlled manner.

The controller 120 may provide signals to the adjustment motor 224a to cause the adjustment motor 224a to operate to adjust the height or vertical position of the first section 206 and/or to adjust the horizontal position of the first section 206 (e.g., by causing the adjustment motor 224a to move the first support arm 222a inward toward and/or outward from the housing 220a). In some implementations, the controller 120 receives signals carrying position information from a position sensor 228a mounted to the first support arm 222a. The position sensor 228a may include a proximity sensor, a Hall effect sensor, a linear variable displacement transducer (LVDT), or another type of sensor that is capable of generating position information. The position information may include information identifying a horizontal position of the first lens adjustment element 216, which the controller 120 may use to determine the horizontal position of the first section 206. Moreover, the position information may include information identifying a height or vertical position of the first lens adjustment element 216, which the controller 120 may use to determine the height or vertical position of the first section 206.

The second lens adjustment element 218 may include a housing 220b, a second support arm 222b attached to the housing 220b and configured to support the second section 208. The second support arm 222b may be inserted in the housing 220b and configured to slide in the housing 220b to adjust the horizontal position of the second section 208. The second lens adjustment element 218 may also include an adjustment motor 224b mounted to the housing 220b. The adjustment motor 224b may be connected to one or more gears, sprockets, and/or other internal components that, together, are configured to adjust the height or vertical position of the second lens adjustment element 218 (and thus, the height or vertical position of the second section 208). The adjustment motor 224b may include a stepper motor, a DC motor, or another type of motor. The adjustment motor 224b may move the second lens adjustment element 218 along the elongated support member 214. In particular, the adjustment motor 224b may move the second lens adjustment element 218 along a track 226b on the elongated support member 214. The gears and/or sprockets in the housing 220b may interface with the track 226b to move the second lens adjustment element 218 up and down along the elongated member 214 in a precise and controlled manner.

The controller 120 may provide signals to the adjustment motor 224b to cause the adjustment motor 224b to operate to adjust the height or vertical position of the second section 208 and/or to adjust the horizontal position of the second section 208 (e.g., by causing the adjustment motor 224b to move the second support arm 222b inward toward and/or outward from the housing 220b). In some implementations, the controller 120 receives signals carrying position information from a position sensor 228b mounted to the second support arm 222b. The position sensor 228b may include a proximity sensor, a Hall effect sensor, an LVDT, or another type of sensor that is capable of generating position information. The position information may include information identifying a horizontal position of the second lens adjustment element 218, which the controller 120 may use to determine the horizontal position of the second section 208. Moreover, the position information may include information identifying a height or vertical position of the second lens adjustment element 218, which the controller 120 may use to determine the height or vertical position of the second section 208.

As further shown in FIG. 2, the edge exposure tool 100 may further include a radiation source 230. The radiation source 230 may include a deep ultraviolet (UV) radiation source, an extreme UV radiation source, a x-ray radiation source, an electron beam (e-beam) radiation source, or another type of radiation source that is configured to generate and provide a type of radiation that may be used in semiconductor lithography. The radiation source 230 may be connected to the edge exposure lens 110 by a fiber optic cable, and may supply the radiation 112 to the edge exposure lens 110 through the fiber optic cable.

The controller 120 may be communicatively connected with the radiation source 230 to control the radiation source 230. For example, the controller 120 may initiate operation of the radiation source 230, may deactivate the radiation source 230, may control various exposure control parameters of the radiation source 230 described in connection with FIG. 5 herein, and/or may control other operating parameters of the radiation source 230. The controller 120 may also be communicatively connected with the vacuum chuck 102 to control various parameters of the vacuum chuck 102 described in connection with FIG. 5 herein.

As indicated above, FIG. 2 is provided as an example. Other examples may differ from what is described with regard to FIG. 2.

Figure 3A:
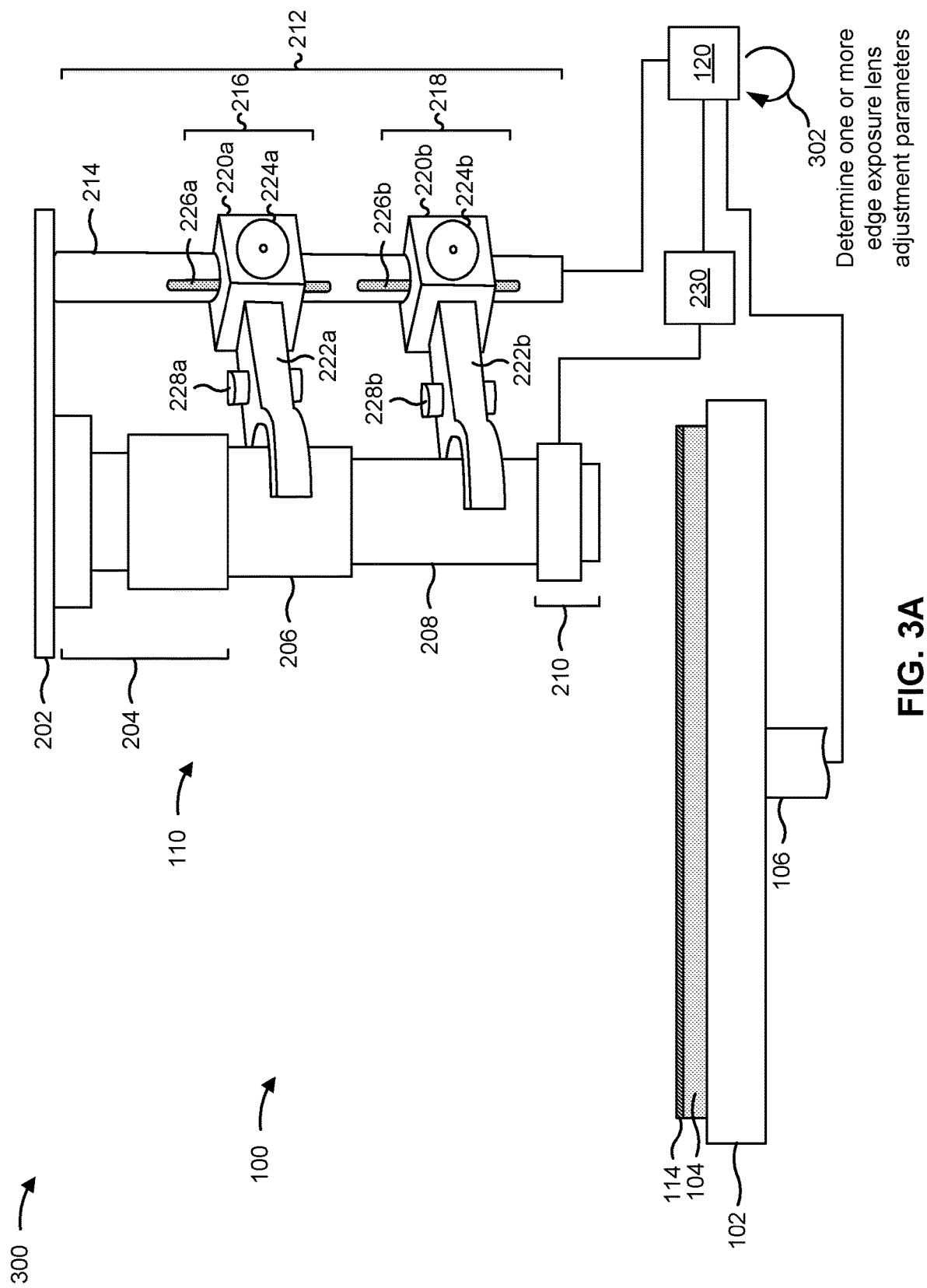
Figure 3C:
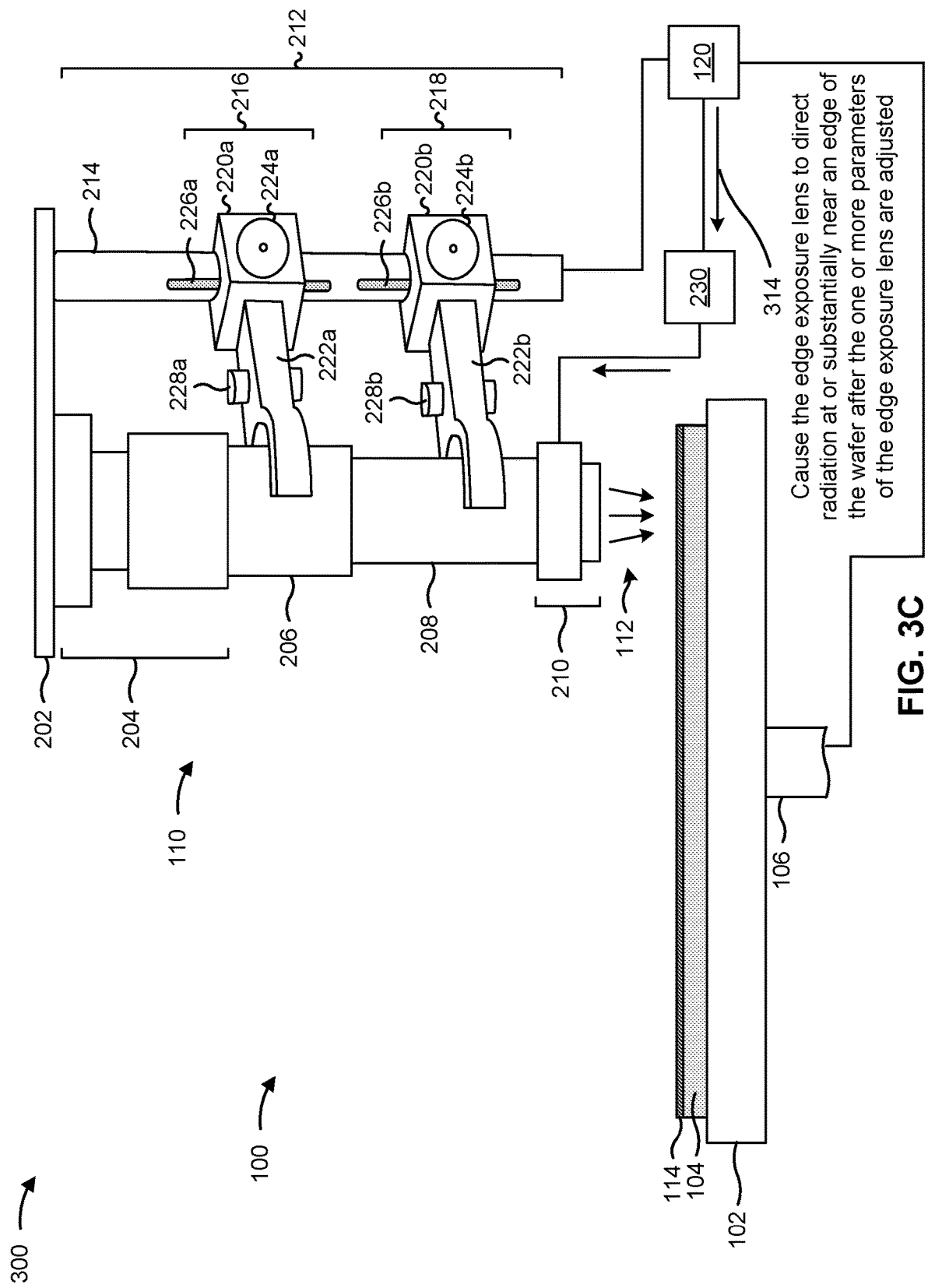

FIGS. 3A-3C are diagrams of an example implementation 300 described herein. In some implementations, the example implementation 300 includes one or more examples of adjusting the edge exposure lens 110 using the lens adjustment device 212. In some implementations, the lens adjustment device 212 adjusts the edge exposure lens 110 between exposure cycles of the edge exposure tool 100 to account for cycle-to-cycle changes and variation in the edge exposure tool. In some implementations, the lens adjustment device 212 may adjust the edge exposure lens 110 based on maintenance or repairs being performed on the edge exposure lens 110. For example, the lens adjustment device 212 may adjust the edge exposure lens 110 based on the edge exposure lens 110 being disassembled to replace the lens section 210. As an example, the lens adjustment device 212 may adjust the edge exposure lens 110 after the first section 206 and the second section 208 are removed from the edge exposure lens 110 and separated such that a lens element of the lens section 210 may be removed and cleaned or replaced. The lens element (or a new lens element) may be installed in the lens section 210, and the first section 206 and the second section 208 may be joined after cleaning or replacement of the lens element. The first section 206 and the second section 208 may be installed back into the edge exposure lens 110, and the techniques described in connection with FIGS. 3A-3C (and in connection with FIG. 5 herein) may be performed to adjust the edge exposure lens 110 (or one or more components thereof) using the lens adjustment device 212.

As shown in FIG. 3A, and by reference number 302, the controller 120 may determine one or more edge exposure lens adjustment parameters for adjusting the position of the edge exposure lens 110 or positions of one or more components of the edge exposure lens 110. The one or more edge exposure lens adjustment parameters for adjusting the position of the edge exposure lens 110 or positions of one or more components of the edge exposure lens 110 from an initial position (or initial positions) to a target position (or target positions). The controller 120 may determine the target position (or target positions), as described in connection with FIG. 5 herein, to achieve a particular performance of the edge exposure lens 110 and/or the edge exposure tool 100, such as an exposure uniformity parameter, an exposure field size, an overlay alignment parameter (e.g., an interlayer alignment between various layers formed on the wafer 104), and/or one or more other performance parameters. Additionally or alternatively, the controller 120 may determine the target position (or target positions) based on a size of the wafer 104 to be exposed, based on a pattern to be transferred to the wafer 104, based on a thickness of the wafer 104, based on a thickness of the photoresist layer 114, and/or based on one or more other parameters.

As shown in FIG. 3B, and by reference number 304, the controller 120 may automatically cause one or more parameters of the edge exposure lens 110 to be adjusted based on the one or more edge exposure lens adjustment parameters. For example, the controller 120 may provide a signal to the lens adjustment device 212 to cause the lens adjustment device 212 to adjust a height or vertical position 306 of the first section 206 based on determining the one or more edge exposure lens adjustment parameters. The controller 120 may receive position information from the position sensor 228a indicating the initial height or vertical position of the first section 206, may provide the signal to the lens adjustment device 212 to activate the adjustment motor 224a to cause the adjustment motor 224a to move the first lens adjustment element 216 (which causes the first section 206 to move from the initial height or vertical position) based on the one or more edge exposure lens adjustment parameters. The controller 120 may continue to receive the position information from the position sensor 228a, and may determine that the first section 206 has reached a target height or vertical position based on the position information. The controller 120 may provide a signal to the lens adjustment device 212 (or may cease providing the signal to the lens adjustment device 212) to deactivate the adjustment motor 224a based on determining that the first section 206 is at the target height or vertical position.

As another example, the controller 120 may provide a signal to the lens adjustment device 212 to cause the lens adjustment device 212 to adjust a height or vertical position 308 of the second section 208. The controller 120 may receive position information from the position sensor 228b indicating the initial height or vertical position of the second section 208, may provide the signal to the lens adjustment device 212 to activate the adjustment motor 224b to cause the adjustment motor 224b to move the second lens adjustment element 218 (which causes the second section 208 to move from the initial height or vertical position) based on the one or more edge exposure lens adjustment parameters. The controller 120 may continue to receive the position information from the position sensor 228b, and may determine that the second section 208 has reached a target height or vertical position based on the position information. The controller 120 may provide a signal to the lens adjustment device 212 (or may cease providing the signal to the lens adjustment device 212) to deactivate the adjustment motor 224b based on determining that the second section 208 is at the target height or vertical position.

As another example, the controller 120 may provide one or more signals to the lens adjustment device 212 to cause the lens adjustment device 212 to adjust a distance 310 between the lens section 210 of the edge exposure lens 110 and a top surface of the photoresist layer 114 on the wafer 104. In some implementations, the controller 120 may cause the first lens adjustment element 216 to adjust the height or vertical position 306 of the first section 206 in order to adjust the distance 310. In some implementations, the controller 120 may cause the second lens adjustment element 218 to adjust the height or vertical position 308 of the second section 208 in order to adjust the distance 310. In some implementations, the controller 120 may cause the first lens adjustment element 216 to adjust the height or vertical position 306 of the first section 206 and the second lens adjustment element 218 to adjust the height or vertical position 308 of the second section 208 in order to adjust the distance 310.

As another example, the controller 120 may provide one or more signals to the lens adjustment device 212 to cause the lens adjustment device 212 to adjust a horizontal position 312 of the edge exposure lens 110. The controller 120 may receive position information from the position sensor 228a and/or the position sensor 228b indicating the initial horizontal position of the first section 206 and the second section 208, respectively. The controller 120 may provide the one or more signals to the lens adjustment device 212 to activate the adjustment motor 224a and/or the adjustment motor 224b to move the first support arm 222a and the second support arm 222b inward or outward based on the one or more edge exposure lens adjustment parameters to adjust the horizontal position 312. The controller 120 may continue to receive the position information from the position sensor 228a and/or the position sensor 228b, and may determine that the first section 206 and the second section 208 have reached a target horizontal position based on the position information. The controller 120 may provide a signal to the lens adjustment device 212 (or may cease providing the signal to the lens adjustment device 212) to deactivate the adjustment motor 224a and the adjustment motor 224b based on determining that the first section 206 and the second section 208 are at the target horizontal position.

Additionally or alternatively to causing the one or more parameters of the edge exposure lens to be adjusted, the controller 120 may cause one or more exposure control parameters of the edge exposure tool 100 to be adjusted. For example, the controller 120 may communicate with and/or provide signals to the vacuum chuck 102, the edge exposure lens 110, and/or the radiation source 230 to cause one or more exposure control parameters of the edge exposure tool 100 to be adjusted as described in connection with FIG. 5 herein.

As shown in FIG. 3C, and by reference number 314, the controller 120 may cause the edge exposure lens 110 to direct the radiation 112 at or approximately near the edge of the wafer 104 after the one or more parameters of the edge exposure lens 110 are adjusted (and/or after other parameters of the edge exposure tool 100 are adjusted). For example, the controller 120 may provide a signal to the radiation source 230 to activate the radiation source 230 and to cause the radiation source to provide the radiation 112 to the edge exposure lens 110 through the fiber optic cable. The radiation 112 may travel along the fiber optic cable to the edge exposure lens 110, and may travel through the lens section 210 of the edge exposure lens 110, which directs the radiation 112 toward the photoresist layer 114 on the wafer 104 in an exposure field 116 a distance 118 from the edge of the wafer 104.

As indicated above, FIGS. 3A-3C are provided as one or more examples. Other examples may differ from what is described with regard to FIGS. 3A-3C.

Figure 4:
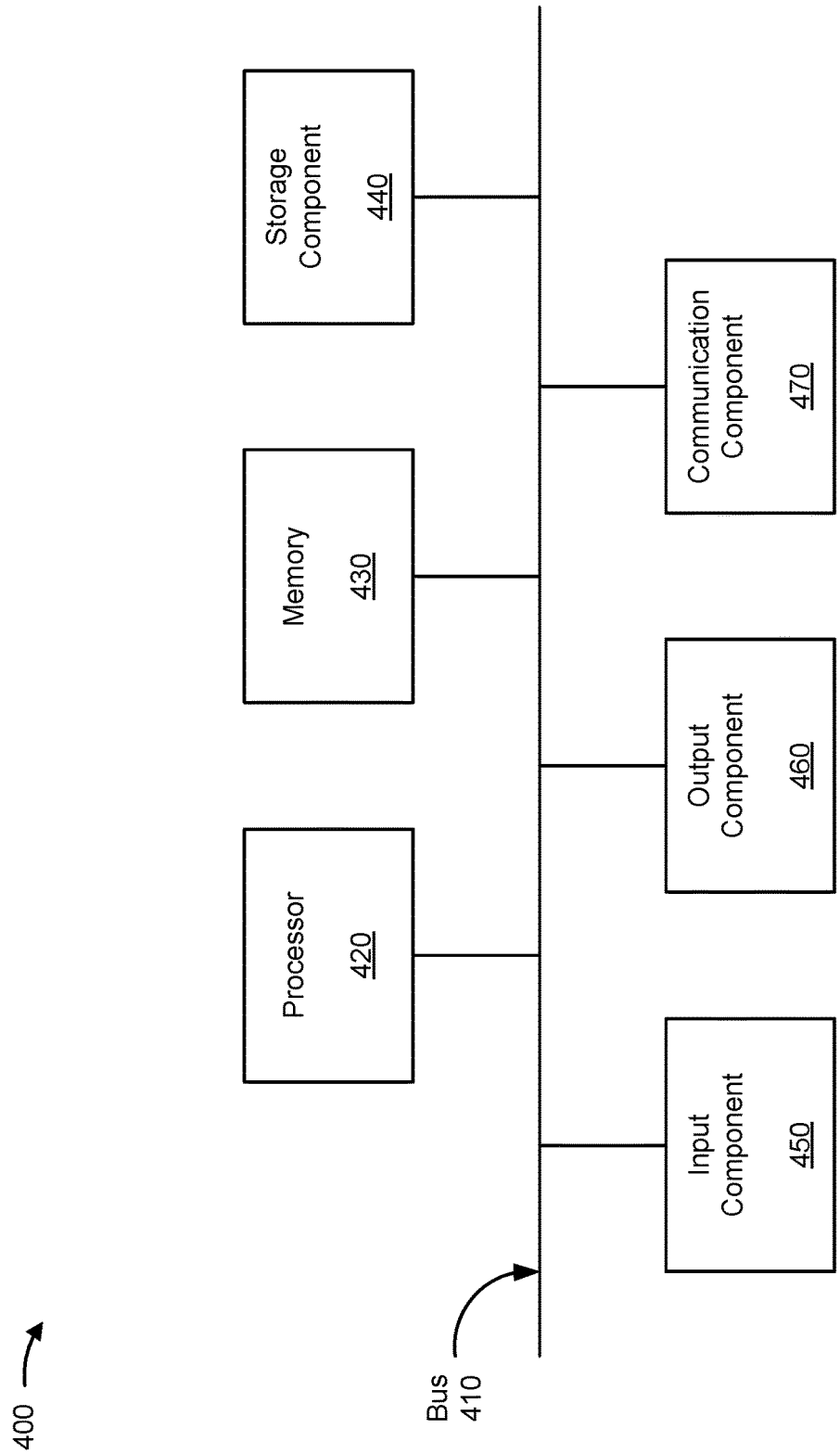
FIG. 4 is a diagram of example components of one or more devices of FIGS. 1 and 2.

FIG. 4 is a diagram of example components of a device 400, which may correspond to the controller 120, the adjustment motor 224a, the adjustment motor 224b, the position sensor 228a, the position sensor 228b, and/or the radiation source 230. In some implementations, the controller 120, the adjustment motor 224a, the adjustment motor 224b, the position sensor 228a, the position sensor 228b, and/or the radiation source 230 may include one or more devices 400 and/or one or more components of device 400. As shown in FIG. 4, device 400 may include a bus 410, a processor 420, a memory 430, a storage component 440, an input component 450, an output component 460, and a communication component 470.

Bus 410 includes a component that enables wired and/or wireless communication among the components of device 400. Processor 420 includes a central processing unit, a graphics processing unit, a microprocessor, a controller, a microcontroller, a digital signal processor, a field-programmable gate array, an application-specific integrated circuit, and/or another type of processing component. Processor 420 is implemented in hardware, firmware, or a combination of hardware and software. In some implementations, processor 420 includes one or more processors capable of being programmed to perform a function. Memory 430 includes a random access memory, a read only memory, and/or another type of memory (e.g., a flash memory, a magnetic memory, and/or an optical memory).

Storage component 440 stores information and/or software related to the operation of device 400. For example, storage component 440 may include a hard disk drive, a magnetic disk drive, an optical disk drive, a solid state disk drive, a compact disc, a digital versatile disc, and/or another type of non-transitory computer-readable medium. Input component 450 enables device 400 to receive input, such as user input and/or sensed inputs. For example, input component 450 may include a touch screen, a keyboard, a keypad, a mouse, a button, a microphone, a switch, a sensor, a global positioning system component, an accelerometer, a gyroscope, and/or an actuator. Output component 460 enables device 400 to provide output, such as via a display, a speaker, and/or one or more light-emitting diodes. Communication component 470 enables device 400 to communicate with other devices, such as via a wired connection and/or a wireless connection. For example, communication component 470 may include a receiver, a transmitter, a transceiver, a modem, a network interface card, and/or an antenna.

Device 400 may perform one or more processes described herein. For example, a non-transitory computer-readable medium (e.g., memory 430 and/or storage component 440) may store a set of instructions (e.g., one or more instructions, code, software code, and/or program code) for execution by processor 420. Processor 420 may execute the set of instructions to perform one or more processes described herein. In some implementations, execution of the set of instructions, by one or more processors 420, causes the one or more processors 420 and/or the device 400 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 4 are provided as an example. Device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
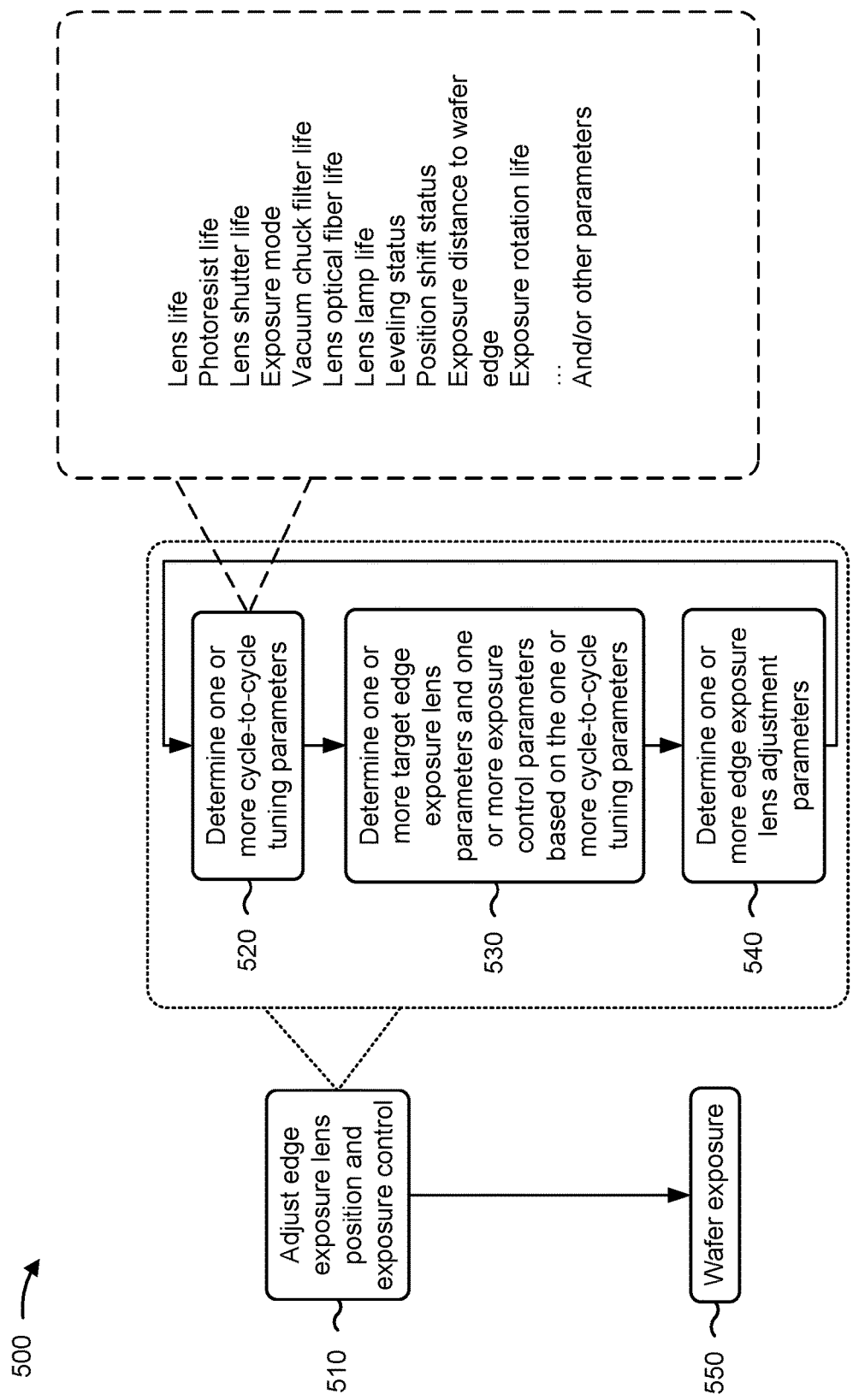

FIG. 5 is a flowchart of an example process 500 associated with adjusting an edge exposure lens. In some implementations, one or more process blocks of FIG. 5 may be performed by a controller (e.g., the controller 120, the device 400). In some implementations, one or more process blocks of FIG. 5 may be performed by another device or a group of devices separate from or including the controller, such as lens adjustment device (e.g., lens adjustment device 212), a radiation source (e.g., the radiation source 230), and/or another device. Additionally, or alternatively, one or more process blocks of FIG. 5 may be performed by one or more components of device 400, such as processor 420, memory 430, storage component 440, input component 450, output component 460, and/or communication component 470.

As shown in FIG. 5, process 500 may include adjusting a position of the edge exposure lens 110 included in the edge exposure tool 100 and adjusting an exposure control for the edge exposure tool 100 (block 510). For example, the controller 120 may determine one or more edge exposure lens adjustment parameters for adjusting the position of the edge exposure lens 110, and may determine one or more exposure adjustment parameters for adjusting the exposure control for the edge exposure tool 100.

Process 500 may include a plurality of operations for determining the adjustment parameters (e.g., the one or more edge exposure lens adjustment parameters and the one or more exposure adjustment parameters). As shown in FIG. 5, process 500 may include determining one or more cycle-to-cycle tuning parameters for the edge exposure tool 100 (block 520). For example, the controller 120 may determine the one or more cycle-to-cycle tuning parameters. The cycle-to-cycle tuning parameters may include parameters of the edge exposure tool 100 that may change from exposure cycle to exposure cycle. An exposure cycle may include one exposure operation on a wafer 104 performed by the edge exposure tool 100. For example, an exposure cycle may include placing the wafer 104 on the vacuum chuck 102, spinning or rotating the vacuum chuck 102 to spin/rotate the wafer 104, and exposing the photoresist layer 114 on the wafer 104 to the radiation 112 for one or more revolutions or complete rotations of the wafer 104.

As further shown in FIG. 5, in some implementations, the one or more cycle-to-cycle tuning parameters include a lens life of the edge exposure lens 110 (e.g., a quantity of hours or exposure cycles of use of the lens section 210 installed in the edge exposure lens 110). In some implementations, the one or more cycle-to-cycle tuning parameters include a photoresist life. The photoresist life may refer to how long the raw material of the photoresist layer 114 was stored in a storage tank prior to being deposited on the wafer 104. In some implementations, the one or more cycle-to-cycle tuning parameters include a lens shutter life. The edge exposure lens 110 may include one or more shutters that open and close at various times and/or at various periodicities. The shutter may be used to expose portions of the photoresist layer 114 to the radiation source 230 when the shutter is open, and to prevent exposure to other portions of the photoresist layer 114 when the shutter is closed. The shutter may also be used to control the total exposure time of a particular portion of the photoresist layer 114. In some implementations, the one or more cycle-to-cycle tuning parameters include an exposure mode, which may include a round exposure mode (e.g., an exposure mode in which round areas of the wafer 104 are exposed), a linear exposure mode (e.g., an exposure mode in which straight or rectangular areas of the wafer 104 are exposed, such as wafer notch areas), and/or another exposure mode.

In some implementations, the one or more cycle-to-cycle tuning parameters include a vacuum chuck filter life (e.g., a quantity of hours or exposure cycles of use accumulated for the filter installed in the vacuum chuck 102). In some implementations, the one or more cycle-to-cycle tuning parameters include a lens optical fiber life (e.g., a quantity of hours or exposure cycles of use accumulated for the optical fiber cable through which the radiation 112 is supplied to the edge exposure lens 110 from the radiation source 230. In some implementations, the one or more cycle-to-cycle tuning parameters include a lens lamp life (e.g., a quantity of hours or exposure cycles of use accumulated for the radiation lamp installed in the radiation source 230). In some implementations, the one or more cycle-to-cycle tuning parameters include a leveling status of the vacuum chuck 102 (e.g., whether the vacuum chuck 102 is level, out of level, and/or an amount and direction in which the vacuum chuck 102 is out of level).

In some implementations, the one or more cycle-to-cycle tuning parameters include a position shift status of the vacuum chuck 102 (e.g., an amount and direction of a horizontal shift of the vacuum chuck 102 and/or an amount and direction of a vertical shift of the vacuum chuck 102).

In some implementations, the one or more cycle-to-cycle tuning parameters include an exposure distance to the edge of the wafer 104, which may indicate a distance 118 between the edge of the wafer 104 and the exposure field 116. In some implementations, the one or more cycle-to-cycle tuning parameters include an exposure rotation life of the edge exposure tool 100 (e.g., a quantity of hours or exposure cycles for the overall edge exposure tool 100).

In some implementations, the one or more cycle-to-cycle tuning parameters include other parameters. In some implementations, the one or more cycle-to-cycle tuning parameters include a combination of the parameters described above and/or one or more other parameters.

As further shown in FIG. 5, process 500 may include determining one or more target edge exposure lens parameters and one or more exposure control parameters based on the one or more cycle-to-cycle tuning parameters (block 530). For example, the controller 120 may determine the one or more target edge exposure lens parameters and the one or more exposure control parameters based on the one or more cycle-to-cycle tuning parameters. The one or more target edge exposure lens parameters and the one or more exposure parameters may include parameters that are determined to achieve a particular performance of the edge exposure lens 110 and/or the edge exposure tool 100, such as an exposure uniformity parameter, an exposure field size, an overlay alignment parameter (e.g., an interlayer alignment between various layers formed on the wafer 104), and/or one or more other performance parameters. Additionally or alternatively, the controller 120 may determine the one or more target edge exposure lens parameters and/or the one or more exposure control parameters based on a size of the wafer 104 to be exposed, based on a pattern to be transferred to the wafer 104, based on a thickness of the wafer 104, based on a thickness of the photoresist layer 114, and/or based on one or more other parameters.

In some implementations, the one or more target edge exposure lens parameters include a target horizontal position for the edge exposure lens 110. For example, the controller 120 may determine target horizontal position based on the horizontal shift of the vacuum chuck 102, based on a leveling status of the vacuum chuck 102, and/or one or more other parameters. In some implementations, the controller 120 may determine a target angle of the edge exposure lens 110 (e.g., an angle of the edge exposure lens 110 relative to the planar surface of the platform of the vacuum chuck 102) based on the leveling status of the vacuum chuck 102. In these examples, the controller 120 may determine the target horizontal position and the target angle to account for and/or accommodate horizontal shifting of the vacuum chuck 102 over time and/or over a plurality of exposure cycles.

In some implementations, the one or more target edge exposure lens parameters include a target distance parameter for the edge exposure lens 110. For example, the controller 120 may determine the target distance parameter between lens section 210 and the top surface of the photoresist layer 114 on the wafer 104. The controller 120 may determine the target distance parameter based on the exposure field of the edge exposure lens 110, based on a thickness of the wafer 104, based on a thickness of the photoresist layer 114, and/or based on one or more other parameters. For example, the controller 120 may determine the target distance parameter such that the exposure field is achieved for the thickness of the wafer 104 and the thickness of the photoresist layer 114.

In some implementations, the one or more target edge exposure lens parameters include a target vertical position for the first section 206 and/or a target vertical position for the second section 208 of the edge exposure lens 110. The controller 120 may determine target vertical position for the first section 206 and/or a target vertical position for the second section 208 based on the vertical shift of the vacuum chuck 102, based on a leveling status of the vacuum chuck 102, and/or other parameters. In some implementations, the controller 120 determines the target vertical position for the first section 206 and/or the target vertical position for the second section 208 further based on the target distance parameter between lens section 210 and the top surface of the photoresist layer 114 on the wafer 104. In these examples, the controller 120 may determine the target vertical position for the first section 206 and/or the target vertical position for the second section 208 to account for vertical shifting of the vacuum chuck 102 over time and/or over a plurality of exposure cycles to achieve the target distance parameter.

In some implementations, the one or more target exposure control parameters a target exposure field size for the exposure field 116 of the edge exposure lens. As an example, the controller 120 may determine the target exposure field size based on the size of the pattern to be transferred to the wafer 104, based on the size of the wafer 104, and/or based on one or more other parameters.

In some implementations, the one or more target exposure control parameters may include a target exposure intensity for the radiation 112 that is to be directed toward the photoresist layer 114. For example, the controller 120 may increase the target exposure intensity as the lifetime of the lens section 210 increases (e.g., as indicated by the lens life included in the one or more cycle-to-cycle tuning parameters) and/or may decrease the target exposure intensity based on the lens section 210 being replaced, cleaned, or serviced. In this way, the controller 120 may adjust the target exposure intensity of the edge exposure lens 110 to stabilize the illuminance of the lens section 210 and to account for fogging of the lens section 210 over time, which may otherwise cause a drop in exposure intensity. Additionally or alternatively, the controller 120 may increase the target radiation based on an increased lens optical fiber life and/or an increased lamp life (e.g., as indicated by the lens life included in the one or more cycle-to-cycle tuning parameters).

In some implementations, the one or more target exposure control parameters may include a target rotation duration. The target rotation duration may include, for example, a time duration (e.g., seconds, minutes) or a quantity of rotations of the wafer 104. For example, the controller 120 may increase the exposure rotation time of the wafer 104 for a relatively thicker photoresist layer 114, may decrease the exposure rotation time of the wafer 104 for a relatively thinner photoresist layer 114, and/or may increase or decrease the exposure rotation time of the wafer 104 to account for photoresist life of the photoresist layer 114 (e.g., as indicated by the lens life included in the one or more cycle-to-cycle tuning parameters). As another example, the controller 120 may increase the exposure rotation time to provide a longer exposure time based on an estimated decrease in exposure intensity resulting from an increased lens life, an increased lens optical fiber life, and/or an increased lamp life (e.g., as indicated by the lens life included in the one or more cycle-to-cycle tuning parameters).

In some implementations, the one or more target exposure control parameters may include a target shutter opening delay for the shutter of the edge exposure lens 110 and/or the one or more target exposure control parameters may include shutter closing delay for the shutter of the edge exposure lens 110. For example, the controller 120 may determine to increase or decrease the shutter opening delay based on an estimated signal propagation delay between the controller 120 and the edge exposure lens 110 to synchronize the exposure of the wafer 104 to an exposure plan. For example, the controller 120 may increase the target shutter opening delay and/or may increase the target shutter closing delay for higher estimated propagation delay. As another example, the controller 120 may decrease the target shutter opening delay and/or may decrease the target shutter closing delay for lower estimated propagation delay. Additionally or alternatively, the controller 120 may determine the target shutter opening delay and/or the target shutter closing delay based on an exposure mode for the wafer 104 to be exposed.

In some implementations, the controller 120 determines the one or more target edge exposure lens parameters and/or the one or more target exposure control parameters using various data processing techniques, such as big data mining, machine learning, and/or neural network processing. In some implementations, the controller 120 uses big data mining to collect and store cycle-to-cycle tuning parameter data from thousands (or more) of exposure cycles of the edge exposure tool 100 or an edge exposure tool similar to the edge exposure tool 100 (e.g., an edge exposure tool that is a same make and model as the edge exposure tool 100, an edge exposure tool that has common characteristics as the edge exposure tool 100, or the like). In these examples, the controller 120 may obtain the cycle-to-cycle tuning parameter data from various sensors and/or actuators of the edge exposure tool 100, may receive the cycle-to-cycle tuning parameter data as input from an operator, and/or may receive the cycle-to-cycle tuning parameter data from one or more other sources. The controller 120 may store the cycle-to-cycle tuning parameter data in a database or data store, and may structure the cycle-to-cycle tuning parameter data (e.g., if received as unstructured data) using various data structuring techniques (e.g., tagging, generating metadata, categorizing, and/or one or more other techniques). Moreover, the controller 120 may use big data mining to collect and store exposure control parameters and/or edge exposure lens parameters that were used for the multiple thousands of exposure cycles of the edge exposure tool 100, and may collect and store performance data from the multiple thousands of exposure cycles of the edge exposure tool 100 in a similar manner. The database or data store may be continuously and/or periodically updated as data from subsequent exposures becomes available.

In some implementations, the controller 120 uses machine learning and/or neural network processing for decision making when determining the one or more target edge exposure lens parameters and/or the one or more target exposure control parameters. Machine learning involves computers learning from data to perform tasks and/or to make decisions. Machine learning algorithms are used to train machine learning models based on sample data, known as "training data." Once trained, machine learning models may be used to make predictions, decisions, or classifications relating to new observations. Here, the controller 120 may train a machine learning model on the cycle-to-cycle tuning parameter data, the exposure control parameters, the edge exposure lens parameters, and/or the performance data from thousands (or more) of exposure cycles of the edge exposure tool 100. Alternatively, a separate device (e.g., a server device) may train the machine learning model and may provide the trained machine learning model for use by the controller 120.

The machine learning model may be trained on the data from thousands (or more) of exposure cycles using a supervised learning technique and/or an unsupervised learning technique. In some implementations, the controller 120 trains a regression model, a decision tree model, a Naïve Bayes classifier, a k nearest neighbor (KNN) model, or another type of supervised machine learning model by specifying a target or outcome variable that is to be predicted from an independent set of variables. In some implementations, the controller 120 uses a neural network (e.g., an artificial neural network that includes thousands or millions (or more) of artificial neurons or processing nodes) to train the machine learning model using a deep learning technique. The nodes in the neural network may be layered and weighted. A node in a layer of the neural network may be connected to a plurality of nodes in a lower layer of the neural network, and may receive a weight from each of the nodes in the lower layer. The node may update the weights and feed forward a weight to one or more nodes in a higher layer in the neural network if the weight satisfies a threshold (which may be referred to as a "firing" of the node). The weights in the neural network may be adjusted and/or updated as the neural network continues to process the training data provided to the machine learning model until similar training data parameters yield similar weights through the neural network.

The machine learning model may generate a function that maps inputs to the machine learning model (e.g., the cycle-to-cycle tuning parameter data, the exposure control parameters, the edge exposure lens parameters, the performance data, and/or one or more initial parameters for the edge exposure tool 100) to specified outputs from the machine learning model (e.g., one or more specified performance parameters of the edge exposure tool 100). In this way, the controller 120 uses the function (e.g., determined by the machine learning model) to determine the one or more target edge exposure lens parameters and/or the one or more target exposure control parameters that may be used to achieve a specified performance of the edge exposure lens 110 and/or the edge exposure tool 100, such as a specified exposure uniformity, a specified exposure field size, a specified overlay alignment, and/or one or more other specified performance parameters.

As further shown in FIG. 5, process 500 may include determining one or more edge exposure lens adjustment parameters (block 540). For example, the controller 120 may determine the one or more edge exposure lens adjustment parameters based on the one or more target edge exposure lens parameters and one or more initial edge exposure lens parameters for the edge exposure lens 110. The one or more initial edge exposure lens parameters may include an initial position (e.g., horizontal position, vertical position, exposure angle, distance from the wafer 104, or the like), may include a starting position (e.g., after powering on the edge exposure tool 100), or another type of initial position. The controller 120 may receive position information from the position sensors 228a and 22b, which may indicate the initial position of the edge exposure lens 110, the initial position of the first section 206, the initial position of the second section 208, the initial position of the lens section 210, and/or one or more other initial positions of the edge exposure lens 110.

The one or more edge exposure lens adjustment parameters may include parameters to adjust the edge exposure lens 110 from the initial position to the target position determined by the controller 120. For example, a vertical position parameter for the first section 206 may include a parameter that identifies an amount of displacement for moving the first section 206 from the initial position of the first section 206 to the target vertical position of the first section 206.

In some implementations, the controller 120 determines other adjustment parameters for the edge exposure tool 100. For example, the controller 120 may determine a vacuum intensity adjustment parameter for the vacuum chuck 102. In these examples, the vacuum performance for a particular vacuum intensity setting for the vacuum chuck 102 may decrease over time and over a plurality of exposure cycles as the vacuum filter of the vacuum chuck 102 filters dust and debris from the vacuum lines of the vacuum chuck 102. The increased amount of dust and debris captured by the vacuum filter may decrease the airflow through the vacuum filter, thereby decreasing the vacuum performance of the vacuum chuck 102. Accordingly, the controller 120 may determine the vacuum intensity adjustment parameter to increase the vacuum intensity of the vacuum chuck 102 as the vacuum filter life of the vacuum filter increases to maintain a particular vacuum performance. Additionally or alternatively, the controller 120 may determine the vacuum intensity adjustment parameter to account for difference sized wafers. For example, the controller 120 may increase the vacuum intensity for larger wafers (e.g., 300 mm wafers) and may decrease the vacuum intensity for smaller wafers (e.g., 150 mm wafers, 200 mm wafers).

Referring back to block 510, the controller 120 may adjust the position (e.g., the initial position) of the edge exposure lens 110 based on the one or more edge exposure adjustment parameters. In some implementations, the controller 120 causes the lens adjustment device 212 to adjust the vertical position 306 of the first section 206 of the edge exposure lens 110. For example, the controller 120 may provide a signal to the adjustment motor 224a to cause the adjustment motor 224a to move the first section 206 up or down based on a vertical position adjustment parameter for the first section 206 to a target vertical position. In some implementations, the controller 120 causes the lens adjustment device 212 to adjust the vertical position 308 of the second section 208 of the edge exposure lens 110 by providing a signal to the adjustment motor 224b to cause the adjustment motor 224b to move the second section 208 up or down based on a vertical position adjustment parameter for the first section 206 to a target vertical position.

In some implementations, the controller 120 causes the lens adjustment device 212 to adjust the distance 310 between the top surface of the wafer 104 (e.g., the top surface of the photoresist layer 114 on the wafer 104) and the edge exposure lens 110 (e.g., the lens section 210 of the edge exposure lens 110) based on a distance adjustment parameter to a target distance. Adjusting the distance 310 may include adjusting the vertical position 306 of the first section 206 of the edge exposure lens 110, adjusting the vertical position 308 of the second section 208 of the edge exposure lens 110, or a combination thereof.

In some implementations, the controller 120 causes the lens adjustment device 212 to adjust a horizontal position of the edge exposure lens 110 in one or more directions based on a horizontal position adjustment parameter. For example, the controller 120 may provide a signal to the adjustment motor 224a and the adjustment motor 224b to respectively cause the first support arm 222a and the second support arm 222b to move inward toward the elongated support member 214, outward from the elongated support member 214, and/or to rotate about the elongated support member 214 to adjust the horizontal position of the edge exposure lens 110 to a target horizontal position. The adjustment of the horizontal position of the edge exposure lens 110 may change the distance 118 between the exposure field 116 and the edge of the wafer 104.

In some implementations, the controller 120 causes the lens adjustment device 212 to adjust an angle of the edge exposure lens 110 (e.g., an angle of the edge exposure lens 110 relative to the planar surface of the wafer 104). For example, the controller 120 may provide a signal to the adjustment motor 224a and/or the adjustment motor 224b to respectively cause the first support arm 222a and/or the second support arm 222b to move inward toward the elongated support member 214, outward from the elongated support member 214, and/or to rotate about the elongated support member 214 to adjust the angle of the edge exposure lens 110.

The controller 120 may adjust the exposure control for the edge exposure tool 100 based on the one or more exposure control parameters. In some implementations, the controller 120 causes the edge exposure lens 110 to adjust the exposure field 116 of the edge exposure lens 110 based on an exposure field exposure control parameter to a target exposure field size. As an example, the controller 120 may provide a signal to the edge exposure lens 110 to increase or decrease an aperture through which the radiation 112 is permitted to travel through the lens section 210. Increasing the aperture may increase the size of the exposure field 116, whereas decreasing the aperture may decrease the size of the exposure field 116.

In some implementations, the controller 120 causes the radiation source 230 to increase and/or decrease the exposure intensity of the radiation 112 based on the exposure intensity. For example, the controller 120 may provide a signal to the edge exposure lens 110 to increase and/or decrease the exposure intensity of the radiation 112. In some implementations, the controller 120 causes the radiation source 230 to adjust a lower exposure intensity or a minimum exposure control of the radiation 112 and a reference exposure intensity or reference exposure control. In some implementations, the controller 120 causes the radiation source 230 to adjust the lower exposure intensity and/or the reference exposure intensity to achieve a particular reference exposure intensity range, such as approximately 260 milliwatts per centimeters squared ($mW/cm^2$) to approximately 280 $mW/cm^2$, approximately 260 $mW/cm^2$ to approximately 300 $mW/cm^2$, or another example range.

In some implementations, the controller 120 adjusts the exposure rotation time for the wafer 104 based on an exposure duration exposure control parameter to achieve a target rotation duration. The target rotation duration may include, for example, a time duration (e.g., seconds, minutes) or a quantity of rotations of the wafer 104. For example, the controller 120 may adjust the exposure rotation time of the wafer 104 to 6 rotations, 20 rotations, 22 rotations, 40 rotations, or another quantity of rotations.

In some implementations, the controller 120 causes the edge exposure lens to increase or decrease a shutter opening delay for the shutter of the edge exposure lens 110 and/or a shutter closing delay for the shutter of the edge exposure lens 110. For example, the controller 120 may provide a signal to the edge exposure lens 110 to increase or decrease the shutter opening delay based on a shutter opening delay exposure control parameter to a target shutter opening delay (e.g., 0.1 seconds, 0.2 seconds, or another shutter opening delay). As another example, the controller 120 may provide a signal to the edge exposure lens 110 to increase or decrease the shutter closing delay based on a shutter closing delay exposure control parameter to a target shutter closing delay (e.g., 0.1 seconds, 0.2 seconds, or another shutter closing delay). The exposure opening delay may be a time duration between the edge exposure lens 110 receiving a signal (e.g., from the controller 120) to open the shutter of the edge exposure lens 110 and the time that the edge exposure lens 110 actually opens the shutter. The exposure closing delay may be a time duration between the edge exposure lens 110 receiving a signal (e.g., from the controller 120) to close the shutter of the edge exposure lens 110 and the time that the edge exposure lens 110 actually closes the shutter. The shutter opening delay and the shutter closing delay can be used to compensate for signal propagation delays between the controller 120 and the edge exposure lens 110 to synchronize the exposure of the wafer 104 to an exposure plan.

In some implementations, the controller 120 adjusts one or more other parameters of the edge exposure tool 100. For example, the controller 120 may cause the vacuum chuck 102 to increase or decrease a vacuum intensity of the vacuum chuck 102 based on the vacuum intensity adjustment parameter.

While a plurality of different parameters of the edge exposure tool 100 has been described above, these parameters are simply examples of parameters that might be used. In practice, any single parameter described above or any combination of the parameters described above may be used.

As shown in FIG. 5, process 500 may include exposing the wafer 104 at or approximately near the edge of the wafer 104 to radiation for an exposure cycle before, during, and/or after adjusting the edge exposure lens 110 and before, during, and/or after adjusting the one or more edge exposure adjustment parameters (block 550). The controller 120 may cause the edge exposure tool 100 to expose the wafer 104 by providing a signal to the radiation source 230 to cause the radiation source 230 to emit the radiation 112.

The controller 120 may further cause the edge exposure tool 100 to expose the wafer 104 by providing a signal to the edge exposure lens 110 to open and close a shutter of the edge exposure lens 110 (e.g., to control which portions of the photoresist layer 114 are exposed and a duration of exposure for the portions). The controller 120 may further provide a signal to the spindle 106 of the vacuum chuck 102 to cause the spindle 106 to spin or rotate the wafer 104 when the wafer 104 is exposed to the radiation 112. The controller 120 may further provide a signal to the vacuum chuck 102 to cause the vacuum chuck 102 to generate a vacuum or suction force on the wafer 104 to hold the wafer against the vacuum chuck 102 when the wafer is rotated by the spindle 106.

After completion of the exposure cycle, results of the exposure cycle may be incorporated into the big data database, the machine learning model, and/or the neural network to further refine adjustment parameter determination and exposure control parameter determination for subsequent exposure cycles. In particular, the results (e.g., exposure uniformity information, overlay alignment information, and/or one or more other performance information) and the associated parameters (e.g., edge exposure lens adjustment parameters and/or exposure control parameters) may be used as further training data on which the machine learning model and/or the neural network may be trained to further refine the machine learning model and/or the neural network.

Process 500 may include additional implementations, such as any single implementation or any combination of implementations described above, below, and/or in connection with one or more other processes described elsewhere herein.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

FIG. 6 is a flowchart of an example process 600 associated with adjusting an edge exposure lens. In some implementations, one or more process blocks of FIG. 6 may be performed by a controller (e.g., the controller 120, the device 400). In some implementations, one or more process blocks of FIG. 6 may be performed by another device or a group of devices separate from or including the controller, such as lens adjustment device (e.g., lens adjustment device 212), a radiation source (e.g., the radiation source 230), and/or another device. Additionally, or alternatively, one or more process blocks of FIG. 6 may be performed by one or more components of device 400, such as processor 420, memory 430, storage component 440, input component 450, output component 460, and/or communication component 470.

As shown in FIG. 6, process 600 may include determining one or more edge exposure lens adjustment parameters for an edge exposure lens of an edge exposure tool (block 610). For example, the controller may determine one or more edge exposure lens adjustment parameters for an edge exposure lens 110 of the edge exposure tool 100, as described above.

As further shown in FIG. 6, process 600 may include causing a lens adjustment device of the edge exposure tool to adjust one or more parameters of the edge exposure lens based on the one or more edge exposure lens adjustment parameters (block 620). For example, the controller may cause a lens adjustment device 212 of the edge exposure tool 100 to adjust one or more parameters of the edge exposure lens 110 based on the one or more edge exposure lens adjustment parameters, as described above.

As further shown in FIG. 6, process 600 may include causing the edge exposure lens to direct radiation toward a wafer at or approximately near an edge of the wafer after the one or more parameters of the edge exposure lens are adjusted (block 630). For example, the controller may cause the edge exposure lens to direct the radiation 112 toward the wafer 104 at or approximately near an edge of the wafer 104 after the one or more parameters of the edge exposure lens 110 are adjusted, as described above.

Process 600 may include additional implementations, such as any single implementation or any combination of implementations described below and/or in connection with one or more other processes described elsewhere herein.

In a first implementation, causing the lens adjustment device 212 of the edge exposure tool 100 to adjust the one or more parameters of the edge exposure lens 110 includes causing the lens adjustment device 212 of the edge exposure tool 100 to adjust a distance 310 between the edge exposure lens 110 and the wafer 104 based on the one or more edge exposure lens adjustment parameters. In a second implementation, alone or in combination with the first implementation, causing the lens adjustment device 212 of the edge exposure tool 100 to adjust the one or more parameters of the edge exposure lens 110 includes causing the lens adjustment device 212 of the edge exposure tool 100 to adjust a horizontal position 312 of the edge exposure lens 110 based on the one or more edge exposure lens adjustment parameters.

In a third implementation, alone or in combination with one or more of the first and second implementations, determining the one or more edge exposure lens adjustment parameters includes determining the one or more edge exposure lens adjustment parameters based on one or more cycle-to-cycle tuning parameters for the edge exposure tool 100 (e.g., as described above in connection with FIG. 5). In a fourth implementation, alone or in combination with one or more of the first through third implementations, determining the one or more edge exposure lens adjustment parameters based on the one or more cycle-to-cycle tuning parameters includes determining one or more target edge exposure lens parameters for the edge exposure lens 110 based on the one or more cycle-to-cycle tuning parameters (e.g., as described above in connection with FIG. 5), and determining the one or more edge exposure lens adjustment parameters based on the one or more target edge exposure lens parameters and one or more initial edge exposure lens parameters (e.g., as described above in connection with FIG. 5).

In a fifth implementation, alone or in combination with one or more of the first through fourth implementations, the one or more cycle-to-cycle tuning parameters include at least one of a lens life of a lens section 210 included in the edge exposure lens 110, a lens shutter life of one or more lens shutters included in the edge exposure lens 110, an exposure mode of the edge exposure tool 100, or a chuck vacuum filter life of a chuck vacuum filter included in the edge exposure tool 100. In a sixth implementation, alone or in combination with one or more of the first through fifth implementations, the one or more cycle-to-cycle tuning parameters include at least one of a lens optical fiber life of an optical fiber cable included in the edge exposure tool 100, a lens lamp life of the radiation source 230 included in the edge exposure tool 100, an exposure distance 118 between an exposure field 116 of the edge exposure lens 110 and the edge of the wafer 104, or a leveling status of a vacuum chuck 102, included in the edge exposure tool 100, on which the wafer 104 is positioned.

In a seventh implementation, alone or in combination with one or more of the first through sixth implementations, the one or more edge exposure lens adjustment parameters include at least one of the distance 310 between the edge exposure lens and a top surface of the wafer 104, a vertical position 308 of a first section 208 of the edge exposure lens 110, a vertical position 306 of a second section 208 of the edge exposure lens 110, or the horizontal position 312 of the edge exposure lens 110. In an eighth implementation, alone or in combination with one or more of the first through seventh implementations, the one or more edge exposure lens adjustment parameters include the distance 310 between the lens section 210 of the edge exposure lens 110 and a top surface of a photoresist layer 114 on the wafer 104, and determining the one or more edge exposure lens adjustment parameters includes determining the distance 310 based on at least one of a thickness of the wafer 104, a thickness of the photoresist layer 114, or the exposure field 116 for the wafer 104.

In a ninth implementation, alone or in combination with one or more of the first through eighth implementations, process 600 includes determining (e.g., by the controller) a vacuum intensity for the vacuum chuck 102 configured to support and rotate the wafer 104. In a tenth implementation, alone or in combination with one or more of the first through ninth implementations, process 600 includes determining (e.g., by the controller) one or more exposure control parameters, for the wafer 104 to be processed by the edge exposure tool 100, based on at least one of a thickness of the photoresist layer 114 on the wafer 104 or an amount of fogging of the lens section 210 of the edge exposure lens 110.

In an eleventh implementation, alone or in combination with one or more of the first through tenth implementations, the one or more exposure control parameters include at least one of a reference exposure intensity for the radiation 112 that is to be directed toward the wafer 104 by the edge exposure lens 110, a lower exposure intensity for the radiation 112 that is to be directed toward the wafer 104 by the edge exposure lens 110, a shutter opening delay for the edge exposure lens 110, a shutter closing delay for the edge exposure lens 110, or an exposure rotation time for the wafer 104.

In a twelfth implementation, alone or in combination with one or more of the first through eleventh implementations, process 600 includes receiving (e.g., by the controller 120), from a position sensor 228a, position information associated with the first lens adjustment element 216, determining (e.g., by the controller 120) an initial vertical position of the first section 206 based on the position information associated with the first lens adjustment element 216, determining (e.g., by the controller 120) an adjusted vertical position for the first section 206 based on the initial vertical position, and providing (e.g., by the controller 120), to the adjustment motor 224a, a signal to cause the adjustment motor 224a to move the first lens adjustment element 216 along the elongated support member 214 such that the first section 206 is moved to the adjusted vertical position. In a thirteenth implementation, alone or in combination with one or more of the first through twelfth implementations, process 600 includes determining (e.g., by the controller) at least one of the one or more first adjustment parameters or the one or more second adjustment parameters using at least one of a machine learning model or an artificial neural network.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

In this way, an edge exposure tool includes a lens adjustment device. The lens adjustment device is capable of automatically adjusting various parameters of an edge exposure lens of the edge exposure tool to account for changes in operating parameters of the edge exposure tool over time and from cycle to cycle. The edge exposure tool may include a controller that is capable of determining one or more edge adjustment parameters for the edge exposure lens and one or more exposure control parameters for the edge exposure tool using techniques such as big data mining, machine learning, and neural network processing. The lens adjustment device and the controller are capable of reducing and/or preventing the performance of the edge exposure tool from drifting out of tolerance, which can maintain the operation performance of the edge exposure tool and reduce the likelihood of wafer scratching. Moreover, the lens adjustment device and the controller may reduce the downtime of the edge exposure tool that would otherwise be caused by cleaning and calibration of the edge exposure lens, which increases the productivity and throughput of the edge exposure tool.

As described in greater detail above, some implementations described herein provide an edge exposure tool. The edge exposure tool includes an edge exposure lens. The edge exposure tool includes a lens adjustment device configured to automatically adjust one or more parameters of the edge exposure lens based on one or more edge exposure lens adjustment parameters.

As described in greater detail above, some implementations described herein provide a method. The method includes determining, by a controller of an edge exposure tool, one or more edge exposure lens adjustment parameters for an edge exposure lens of the edge exposure tool. The method includes causing, by the controller, a lens adjustment device of the edge exposure tool to adjust one or more parameters of the edge exposure lens based on the one or more edge exposure lens adjustment parameters. The method includes causing, by the controller, the edge exposure lens to direct radiation toward a wafer at or approximately near an edge of the wafer after the one or more parameters of the edge exposure lens are adjusted.

As described in greater detail above, some implementations described herein provide an edge exposure tool. The edge exposure tool includes a vacuum chuck configured to support a wafer. The edge exposure tool includes an edge exposure lens configured to direct radiation toward an edge of the wafer when the vacuum chuck rotates the wafer, including a first section, and a second section interfaced with the first section; and The edge exposure tool includes a lens adjustment device including a first lens adjustment element configured to automatically adjust one or more first parameters of the first section, and a second lens adjustment element configured to automatically adjust one or more second parameters of the second section.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An edge exposure tool, comprising:
    a lens adjustment device comprising:
        a first lens adjustment element that comprises:
            a first housing,
            a first support arm attached to the first housing, and
            a first position sensor mounted to the first support arm; and
        a second lens adjustment element that comprises:
            a second housing,
            a second support arm attached to the second housing, and
            a second position sensor mounted to the second support arm; and
    a controller configured to:
        cause one or more parameters of an edge exposure lens to be adjusted based on one or more edge exposure lens adjustment parameters.

2. The edge exposure tool of claim 1, wherein the controller, to cause the one or more parameters of the edge exposure lens to be adjusted, is configured to at least one of:
    cause a vertical position of the edge exposure lens to be adjusted, or
    cause a horizontal position of the edge exposure lens to be adjusted.

3. The edge exposure tool of claim 1, wherein the edge exposure lens comprises:
a first adjustable section, and
a second adjustable section.

4. The edge exposure tool of claim 3, wherein the second adjustable section is configured to be inserted in to the first adjustable section.

5. The edge exposure tool of claim 4, wherein the edge exposure lens further comprises:
a lens section attached to the second adjustable section.

6. The edge exposure tool of claim 3, wherein the first lens adjustment element configured to support the first adjustable section; and
wherein the second lens adjustment element configured to support the second adjustable section.

7. The edge exposure tool of claim 1, wherein the controller is further configured to:
determine a distance between the edge exposure lens and a top surface of a photoresists layer on a wafer based on at least one of:
a thickness of the wafer,
a thickness of the photoresist layer, or
an exposure field for the wafer.

8. A method, comprising:
determining, by an edge exposure tool, one or more adjustment parameters for an edge exposure lens;
causing, by the edge exposure tool, the edge exposure lens to be adjusted based on the one or more adjustment parameters,
wherein the edge exposure tool comprises:
a first lens adjustment element that comprises:
a first housing,
a first support arm attached to the first housing, and
a first position sensor mounted to the first support arm; and
a second lens adjustment element that comprises:
a second housing,
a second support arm attached to the second housing, and
a second position sensor mounted to the second support arm; and
causing, by the edge exposure tool, the edge exposure lens to direct radiation toward a wafer at or approximately near an edge of the wafer after the edge exposure lens is adjusted.

9. The method of claim 8, wherein causing the edge exposure lens to be adjusted comprises:
causing a distance between the edge exposure lens and the wafer to be adjusted.

10. The method of claim 8, wherein causing the edge exposure lens to be adjusted comprises:
causing a horizontal position of the edge exposure lens to be adjusted by moving the second support arm inward or outward.

11. The method of claim 8, wherein causing the edge exposure lens to be adjusted comprises:
causing one or more sections of the edge exposure lens to be adjusted at least one of vertically or horizontally.

12. The method of claim 8, further comprising:
determining a target position of the edge exposure lens; and
wherein causing the edge exposure lens to be adjusted comprises:
causing the edge exposure lens to be adjusted based on the target position of the edge exposure lens.

13. The method of claim 8, further comprising:
determining a target position of one or more components of the edge exposure lens; and
wherein causing the edge exposure lens to be adjusted comprises:
causing the edge exposure lens to be adjusted based on the target position of the one or more components.

14. The method of claim 8, wherein determining the one or more adjustment parameters comprises:
determining one or more cycle-to-cycle tuning parameters for the edge exposure tool.

15. An edge exposure tool, comprising:
an edge exposure lens configured to direct radiation toward an edge of a wafer, wherein the edge exposure lens comprises:
a first section, and
a second section interfaced with the first section; and
a lens adjustment device comprising:
a first lens adjustment element configured to adjust the first section, wherein the first lens adjustment element comprises:
a first housing,
a first support arm attached to the first housing and configured to support the first section, and
a first position sensor mounted to the first support arm; and
a second lens adjustment element configured to adjust the second section, wherein the second lens adjustment element comprises:
a second housing,
a second support arm attached to the second housing and configured to support the second section, and
a second position sensor mounted to the second support arm.

16. The edge exposure tool of claim 15, wherein the edge exposure lens further comprises:
a lens section interfaced with the second section.

17. The edge exposure tool of claim 15, wherein the lens adjustment device further comprises:
an elongated support member configured to support the first lens adjustment element and the second lens adjustment element.

18. The edge exposure tool of claim 17, wherein the first lens adjustment element further comprises:
a motor configured to move the first lens adjustment element along the elongated support member.

19. The edge exposure tool of claim 18, further comprising:
a controller configured to:
provide, to the motor, a signal to cause the motor to move the first lens adjustment element along the elongated support member.

20. The edge exposure tool of claim 15, further comprising:
a motor mounted to the first housing; and
a controller configured to:
provide, to the motor, a signal to cause the motor to move the first support arm inward or outward from the first housing.

* * * * *